(12) United States Patent
Imada et al.

(10) Patent No.: US 8,449,787 B2
(45) Date of Patent: May 28, 2013

(54) METHOD FOR WET ETCHING WHILE FORMING INTERCONNECT TRENCH IN INSULATING FILM

(75) Inventors: Tadahiro Imada, Kawasaki (JP); Yoshihiro Nakata, Kawasaki (JP); Koji Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1008 days.

(21) Appl. No.: 12/035,832

(22) Filed: Feb. 22, 2008

(65) Prior Publication Data

US 2008/0206999 A1 Aug. 28, 2008

(30) Foreign Application Priority Data

Feb. 22, 2007 (JP) ................................. 2007-042303

(51) Int. Cl.
*C03C 15/00* (2006.01)
(52) U.S. Cl.
USPC ............................................ 216/83; 216/94
(58) Field of Classification Search
USPC .................................................... 216/83, 94
See application file for complete search history.

(56) References Cited

U.S. PATENT DOCUMENTS

| | | | | |
|---|---|---|---|---|
| 5,057,184 A | * | 10/1991 | Gupta et al. | 216/65 |
| 6,009,888 A | * | 1/2000 | Ye et al. | 134/1.3 |
| 2002/0050489 A1 | * | 5/2002 | Ikegami et al. | 219/121.69 |
| 2008/0067159 A1 | * | 3/2008 | Zhang et al. | 219/121.84 |
| 2008/0073321 A1 | * | 3/2008 | Hyland et al. | 216/41 |
| 2010/0261349 A1 | * | 10/2010 | van Schravendijk et al. | 438/675 |

FOREIGN PATENT DOCUMENTS

| | | |
|---|---|---|
| JP | 61-048581 A | 3/1986 |
| JP | 01-099235 A | 4/1989 |
| JP | 2001-172416 A | 6/2001 |
| JP | 2003-297802 A | 10/2003 |
| JP | 2004-335847 A | 11/2004 |

OTHER PUBLICATIONS

Wikipedia, "Saturated and unsaturated compounds" via http://en.wikipedia.org/wiki/Unsaturated_bond ; 1 page; 2012.*
Britannica Academic Edition, "Unsaturated Polyester" via http://www.britannica.com/EBchecked/topic/1551220/unsaturated-polyester ; 1 pages; No date available.*
Japanese Office Action dated Aug. 16, 2011, issued in corresponding Japanese Patent Application No. 2007-042303.
Partial English translation of Japanese Office Action dated Oct. 25, 2011, issued in corresponding Japanese Patent Application No. 2007-042303.

* cited by examiner

*Primary Examiner* — Binh X Tran
(74) *Attorney, Agent, or Firm* — Westerman, Hattori, Daniels & Adrian, LLP

(57) ABSTRACT

A wet etching method that includes forming an insulating film on a substrate, and irradiating laser light to the insulating film during wet etching of the insulating film using an etching solution.

7 Claims, 12 Drawing Sheets

US 8,449,787 B2

METHOD FOR WET ETCHING WHILE FORMING INTERCONNECT TRENCH IN INSULATING FILM

CROSS-REFERENCE TO RELATED APPLICATIONS

This application is based upon and claims the benefit of priority from the prior Japanese Patent Application No. 2007-42303, filed on Feb. 22, 2007, the entire contents of which are incorporated herein by reference.

TECHNICAL FIELD

The present invention relates to a novel wet etching technology. More specifically, the present invention relates to technology capable of reduction of etching damage which occurs during formation of an interconnect trench during the formation process of, for example, a semiconductor device.

BACKGROUND OF THE INVENTION

Although semiconductor integrated circuits or semiconductor devices, such as a multilayer interconnect device and the like, are known to have increased power consumption due to leakage current within the interconnect layer insulating film, the overall effect of leakage current on the device (semiconductor device) was small during device generations for which spacing of interconnects forming the semiconductor device exceeded 1 µm. However, as the spacing of interconnects becomes less than or equal to 1 µm, the effect on power consumption has increased due to size reduction of interconnect spacing and an increase of dimensions of interconnects. In particular, when circuits in the future are formed using an interconnect spacing less than or equal to 0.1 µm, leakage current of such interconnects becomes large enough to greatly affect device characteristics and working life.

Presently the damascene method is generally used for interconnect formation of such semiconductor devices. According to the damascene method, a trench shaped like the interconnect is first formed in the insulating film by etching. Thereafter, this method forms a copper interconnect in this trench by plating and the like. However, during interconnect trench formation by etching according to this damascene method, the sidewall of this interconnect trench is readily damaged by etching. Thus leakage current increases due to damage arising in the interior of the insulating film. Also TDDB (Time Dependent Dielectric Breakdown) characteristics worsen due to the occurrence of bowing of the interconnect trench and the like. These phenomena become large factors resulting in lowering of reliability and yield during semiconductor device production.

Here the term "bowing" of the interconnect trench is taken to mean an expansion phenomenon of the trench profile in the lateral direction. This phenomenon can be observed, for example, by slicing the etching trench in the depth direction and then viewing the resultant cross section, as shown in FIG. 1A. In this manner, the cross-sectional profile (i.e., interior of the etching trench) expands in the direction (i.e., lateral direction) indicated by the X arrow. The occurrence of this phenomenon is thought to depend on etching isotropism (i.e., a lack of anisotropy). When such bowing occurs, TDDB characteristics worsen due to narrowing of the effective spacing between interconnects. Furthermore, in FIG. 1A, item 181 is a resist, item 182 is an insulating film, and item 183 is an underlayer of the insulating film. Although for illustrative purposes FIG. 1A shows a profile having the greatest expansion (i.e., removal of the interior wall face of the trench) in the vicinity of the center, since actual etching is isotropic, the trench of insulating film 182 has a shape for which bowing near the resist 181 side is larger than the bowing of the lower layer 183 side.

Due to such circumstances, attention is being paid to technologies for the suppression of damage to the insulating film caused by the etching solution during the interconnect formation process.

As a method for suppression of damage to the insulating film by the etching solution when etching is performed by wet etching, the interconnect trench part of the insulating film has been irradiated with light. The light used for irradiation, for example, is ultraviolet light (UV light). For example, refer to the Japanese Patent Application Laid-Open No. 2001-1724161 and No. 2004-335847. According to these citations, by the use of this method, damage by the etching solution to the interconnect trench sidewall can be suppressed, and an increase of dielectric constant due to moisture can be suppressed.

The above mentioned UV light irradiation is thought to perhaps promote hydrophilicity of the irradiated face, a phenomenon which causes faster etching. That is to say, damage to the interconnect trench sidewall due to etching is not suppressed.

However, performance of etching by wet etching using this type of conventional technology is deficient in that the occurrence of damage to the trench part formed in the insulating film by the etching solution can not be suppressed.

SUMMARY OF THE INVENTION

According to one aspect of the present invention, a wet etching method includes forming an insulating film on a substrate, and irradiating laser light to the insulating film during wet etching of the insulating film using an etching solution.

DETAILED DESCRIPTION OF THE EMBODIMENTS

Figure 1A:
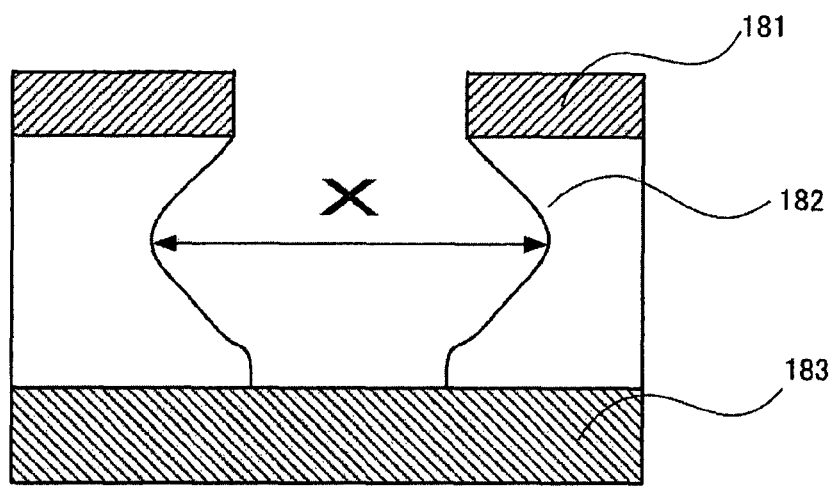
FIGS. 1A and 1B are cross-sectional drawings of bowing of a conventional interconnect trench.

Embodiments of the present invention will be explained below using figures, tables, working examples, and the like. Furthermore, these figures, tables, working examples, and the like and their explanation are illustrative of the present invention and do not limit the scope of the present invention. Of course, other embodiments according to the gist of the present invention come within the meaning of the present invention. Identical elements within the figures are referred to by the same reference numerals throughout the application.

Figure 1B:
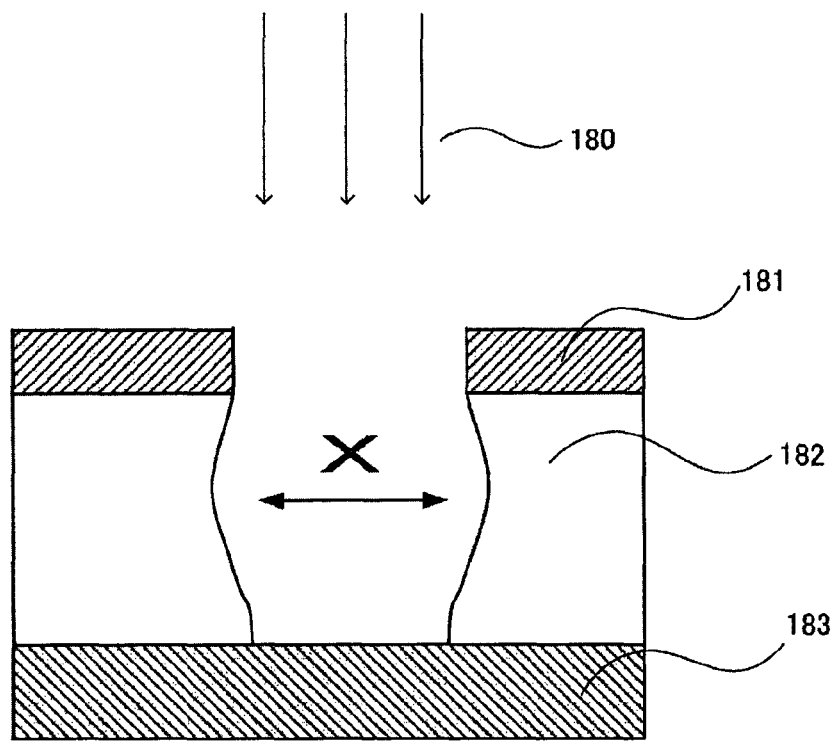

Wet etching will be explained next. That is to say, during etching of a workpiece using the etching solution, when the workpiece is irradiated by a laser light 180, damage by the etching solution can be suppressed, for example, as shown in FIG. 1B, and a clean etching shape can be obtained. For example, when the workpiece is the insulating film of a semiconductor device, this means that it is possible to suppress the increase of leakage current caused by damage due to the etching solution, possible to suppress worsening of TDDB (time dependent dielectric breakdown) characteristics due to bowing of the interconnect trench, and the like. It thus becomes possible to cause an improvement of reliability during semiconductor device production. This improvement is tied to a simultaneous improvement of yield and furthermore makes possible production of a semiconductor device which has low power consumption and high reliability. For example, according to the present embodiment, an LSI interconnect layer can be obtained which has a low effective value of the relative dielectric constant, and by this means, it becomes possible to produce a faster semiconductor device. Furthermore, the term "clean" in referring to the present embodiment means that the desired shape could be obtained correctly. That is to say, one example of the term "clean" is the angle formed by two orthogonal faces not assuming a rounded shape as observed visually under a microscope. Another example of the term "clean" is the ability to suppress bowing.

The above mentioned effect is thought to occur for the reasons described below.

(1) Firstly, under irradiation by laser light, this phenomenon is thought to occur as the trench material of the workpiece irradiated by the laser beam becomes excited, bringing about polarization of the electrons in the chemical bonds of the trench material. Then due to this polarization of electrons, this phenomenon occurs due to the workpiece having increased affinity for the etching solution (i.e., the workpiece can become hydrophilic).

(2) Secondly, this phenomenon is thought to be due to the characteristic of laser light, in contrast to simple UV radiation, of largely rectilinear propagation. Irradiation by this laser light of just the target part becomes possible since laser light has this type of characteristic. That is to say, for example, during formation of an interconnect trench, the laser light is concentrated only at the bottom face, and the laser light does not reach the sidewall. For this reason, etching of the hydrophilized bottom face proceeds preferentially in the downward direction, and the sidewall becomes less hydrophilized. Due to selective hydrophilization in this manner, the sidewall is thought to become less susceptible to damage by the etching solution.

(3) Thirdly, when using irradiation by laser light, etching is thought to proceed more smoothly than conventionally since hydrophilization of the irradiated part is faster in comparison to the use of other light.

Furthermore, in addition to physical damage, damage by the etching solution due to hydrophilization of the sidewall is also caused by a phenomenon of bonding of polar groups, such as the hydroxyl group and the like, to the material of the sidewall due to contact between the etching solution and the hydrophilized sidewall. Such bonding with polar groups causes, for example, and increased absorption of moisture to the bonded part, results in an increase of the dielectric constant, and a rise in the leakage current.

Although irradiation by laser light may be performed during wet etching, such laser light irradiation may also be performed prior to wet etching. Furthermore, the laser light irradiation may be intermittent.

When the laser irradiation is performed through a lens during irradiation of the insulating film (i.e., workpiece) by laser light, resolution can be increased, and scattering of light can be decreased. Cleaner etching becomes possible for this reason, and damage by the etching solution can be suppressed. By the use of a lens in this manner, the direction of the central axis of irradiation of the spreading laser light can be aligned. Furthermore, the utilized lens can be selected appropriately from among known lenses. One example of a lens which can be used is a so-called projection lens. Placement of the lens such that the lens contacts the etching solution is preferred due to the ability to prevent the etching solution surface from causing diffuse reflection of light output from the laser. Such contact is sufficient if the liquid face side of the lens is submerged in the etching solution (i.e., the solution surface side of the lens is in a state of contact with the etching solution). A significant part of the lens may also be immersed in the etching solution.

In this case, however, attention must be paid to assure that the lens does not become contaminated and that air bubbles do not become caught beneath the lens. If contamination occurs, the contamination will cause diffuse reflection. Moreover, if air bubbles are present, diffuse reflection of light due to air bubbles will occur at the interface between the air bubbles and the etching solution, and a possibility exists of the occurrence of damage by the etching solution. A useful means to solve such problems uses a known mechanism for causing constant flow of the etching solution or includes a surfactant in the etching solution. No particular limitation is placed on this surfactant, and the surfactant can be selected appropriately from among known surfactants used for wet etching.

Wavelength range of the utilized laser light is preferably 150 nm to 400 nm, in the so-called UV spectrum. A wavelength in the range of 180 to 300 nm is further preferred. Particular improvement in the effect of the present embodiment is not observed when the wavelength is less than 150 nm. Conversely in this case, there are instances of the occurrence of a phenomenon of increased damage by the etching solution. Moreover, the effect of the present embodiment becomes difficult to obtain when the wavelength exceeds 400 nm.

Although no particular limitation is placed on the type of laser light which can be used for the present embodiment, examples of the laser light which can be cited are: ArF laser light, KrF laser light, KrCl laser light, Nd:YAG 4th harmonic laser light, Nd:YAG 5th harmonic laser light, and the like. The wavelength of each of these laser lights is within the wavelength range of 180 to 300 nm, and these laser lights are preferred from the standpoint of having sufficient light intensity. Specifically, ArF laser light has a wavelength of about 193 nm, KrF laser light has a wavelength of about 248 nm, KrCl laser light has a wavelength of about 222 nm, Nd:YAG 4th harmonic laser light has a wavelength of about 266 nm, and Nd:YAG 5th harmonic laser light has a wavelength of about 213 nm.

Furthermore, the step-and-repeat method or the step-and-scan method for light irradiation is preferably used with such laser light. According to the step-and-repeat method, exposure of the workpiece (e.g. semiconductor chip) is repeated in workpiece units. For example, after exposure is completed for 1-2 semiconductor chips, the exposure location is moved (stepped) according to the size of the semiconductor chip. Then the step-and-repeat method exposes the next semiconductor chip. According to the step-and-scan method, the workpiece is moved-scanned relative to a zonal irradiation light beam (or conversely the zonal irradiation light beam is moved-scanned relative to the workpiece), and exposure is continued in a zonal single exposure field. According to this method, after exposure of one exposure field, step movement by just one exposure field takes place, and the next one exposure field is exposed. Both the step-and-repeat method and the step-and-scan method have the advantage of making exposure of a large field possible while using a small projection optical system.

No particular limitation is placed on the wet etching method of the present embodiment, and the wet etching method can be selected appropriately from among known wet etching methods. Specific examples which can be cited of the wet etching method are the immersion method which immerses the workpiece in the etching solution and the spray method which sprays the etching solution against the workpiece. A more preferred effect is obtainable by use also of ultrasound irradiation during performance of immersion or spraying. During spraying of the etching solution of the spray method, a spray nozzle is normally attached to the tip of a spray discharge aperture, and the etching solution is sprayed out by pressure.

The utilized etching solution of the present invention can be selected appropriately from among known etching solutions as an etching solution suitable for the workpiece. Example etching solutions which can be used include: hydrazine type solutions; aliphatic amine type solutions such as solutions of ethylenediamine, ethanolamine, diethanolamine, hexamethylene diamine, and the like; aromatic amine type solutions such as solutions of benzylamine, p-phenyldiamine, m-phenyldiamine, 3-xylylenediamine, 4-xylylenediamine, and the like; solutions containing alkali metal compounds such as potassium hydroxide, sodium hydroxide, and the like; and basic solutions combined with such.

Any workpiece without particular limitation can be used as the workpiece according to the present embodiment as long as the workpiece can be used as a target for wet etching. However, the effect of the present embodiment is particularly anticipated when the workpiece is "part of a semiconductor device" since damage to a workpiece subjected to wet etching is seen as a problem particularly in the field of semiconductor devices. Furthermore, here the expression "part of a semiconductor device" does not indicate part of a semiconductor device as a completed product but rather is taken to mean part of a semiconductor device occurring at an intermediate step during production of this semiconductor device. The part of the semiconductor device may comprise multiple parts as in the case of the "low dielectric constant film 17 having a vinyl group and TEOS-$SiO_2$ 18 as a protective film" of the below mentioned working example 5.

Although an insulating film provided with an interconnect or via hole can be cited as this part of the semiconductor device, the part of the semiconductor device is not limited to this case.

Although this insulating film is frequently called an interlayer insulating film, whatever the name used for the insulating film, the insulating film can be the workpiece of the present embodiment. Since the effect is particularly great if the workpiece is an LSI interlayer insulating film, the workpiece is preferably the LSI interlayer insulating film. During production of the interconnect of the LSI, the present procedure is particularly effective for lowering of damage undergone by the interlayer insulating film due to the etching solution used for the interlayer insulating film of the LSI.

No particular limitation is placed on the material which can be used for the insulating film. Semiconductor devices having a narrow interconnect spacing, for which the present embodiment can be used with advantage, frequently utilize a low dielectric constant insulating film material. The present embodiment can be used with advantage for such insulating film.

Examples which can be cited as the insulating film material used by the present embodiment are: known insulating film-forming materials having silicon and oxygen as major components; known insulating film-forming materials having silicon, oxygen, and carbon as major components; known insulating film-forming materials having silicon, oxygen, and nitrogen as major components; and organic type known insulating film-forming materials. $SiO_2$ type insulating films, for example, can be cited as specific examples of the insulating film having silicon and oxygen as major components. Additional examples are materials having atomic compositions close to $SiO_2$. Specific known examples of materials having such compositions are: SiOC-containing insulating compositions (e.g., carbon-topped $SiO_2$ produced by CVD with a relative dielectric constant of about 3.3-3.5), SiOCH-containing insulating compositions, SiOCHN-containing insulating compositions, and the like.

The insulating film-forming material containing silicon, oxygen, and carbon as main ingredients, for example, is frequently produced by using as raw materials polycarbosilanes containing silicone and carbon in the backbone or polycarboxysilanes containing oxygen in the backbone. However, the insulating film-forming material containing silicon and carbon as main ingredients may also be produced from other arbitrary materials.

Examples of organic-type known insulating film-forming materials are: methyl group-containing $SiO_2$ (methyl silsesquioxane=MSQ), hydrosilsesquioxane (HSQ), polyimide type materials, SiLK® (The Dow Chemical Company), FLARE® (Honeywell Electric Materials Inc.), HSG (Hitachi Chemical Co., Ltd.), nanoclustering silica (NCS, specific dielectric constant=2.25), amorphous carbon (F doped), and the like.

The insulating film formed from these insulating film-forming materials preferably has a relative dielectric constant less than or equal to 2.7. When the relative dielectric constant is greater than 2.7, density of the insulating film-forming material tends to be high, and thus there is thought to be a high probability that an insulating film having such a relative dielectric constant can withstand dry etching which presently is the major interconnect trench formation method for insulating film. However, when the relative dielectric constant becomes less than or equal to 2.7, there is a tendency for damage to occur due to dry etching as an increase of leakage current or as a lowering of the relative dielectric constant. Thus when the relative dielectric constant is less than or equal to 2.7 in this manner, an effect is readily realized which is the obtaining of a clean pattern shape or lessening of damage due to the etching solution.

From the standpoint of increasing the effect of the laser light, it was judged preferable that the material constituting the workpiece have an unsaturated bond. Specifically, the insulating film-forming material preferably has an unsaturated bond. Furthermore, the insulating film-forming material may be both a silicon containing material and an organic type material.

The reason for this preference is thought to be that electrons in unsaturated bonds are readily polarized due to excitation by laser light. Alternatively as may be the case, the unsaturated bond is thought to be opened and broken by laser light, and this results in reaction with moisture and the like in the atmospheric gas which generates hydrophilic groups. It does not matter whether the material constituting the workpiece has the unsaturated bond in the backbone of the material or in a substituting group.

Any type of element may participate in the unsaturated bond, and this bond may be a double bond, triple bond, conjugated unsaturated bond, or a pi bond. Although the unsaturated bond, for example, can be a C=N bond, preferred bonds in practice are a carbon-to-carbon double bond or a carbon-to-carbon triple bond.

Examples which can be cited of unsaturated bonds within the backbone are the acetylene group, diazo group, and the like. Examples which can be cited of unsaturated double bonds in the substituting group are the vinyl group, phenyl group, and the like. Moreover, examples which can be cited of the insulating film-forming material having an unsaturated bond are vinyl triethoxysilane, vinyl trimethoxysilane, vinyl tripropoxysilane, vinyl trichlorosilane, and the like.

Figure 2A:
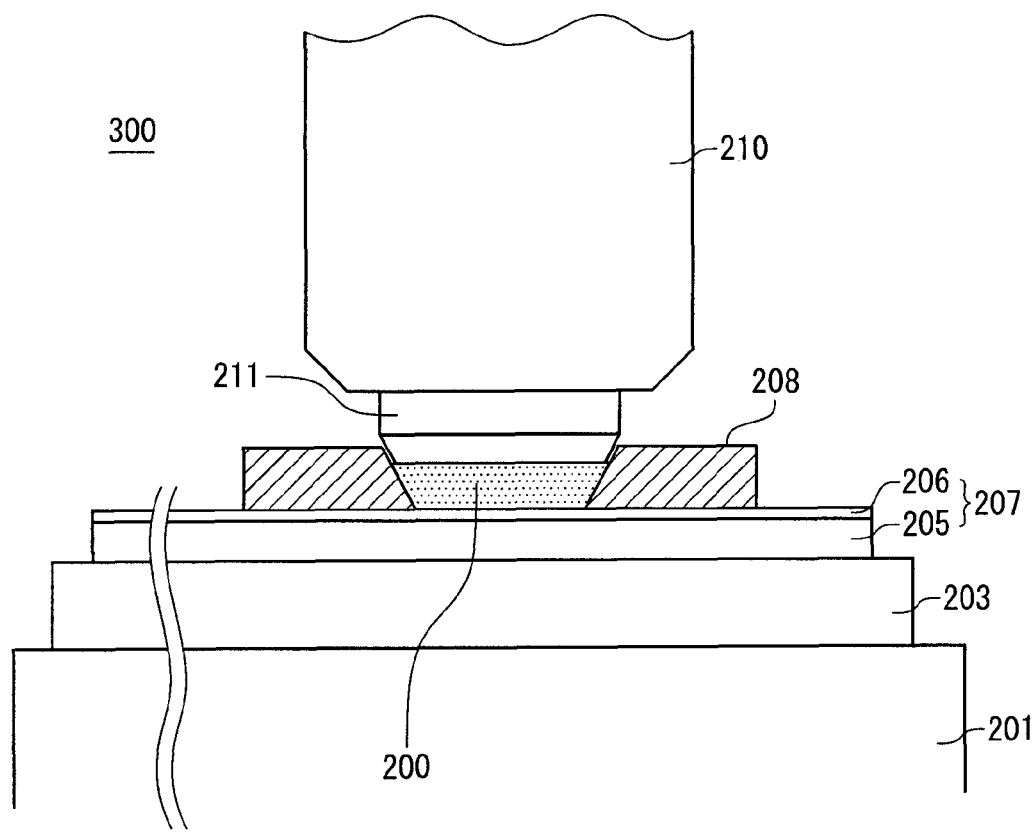
FIGS. 2A and 2B are diagrams showing the wet etching apparatus according to the present embodiment.
Figure 2B:
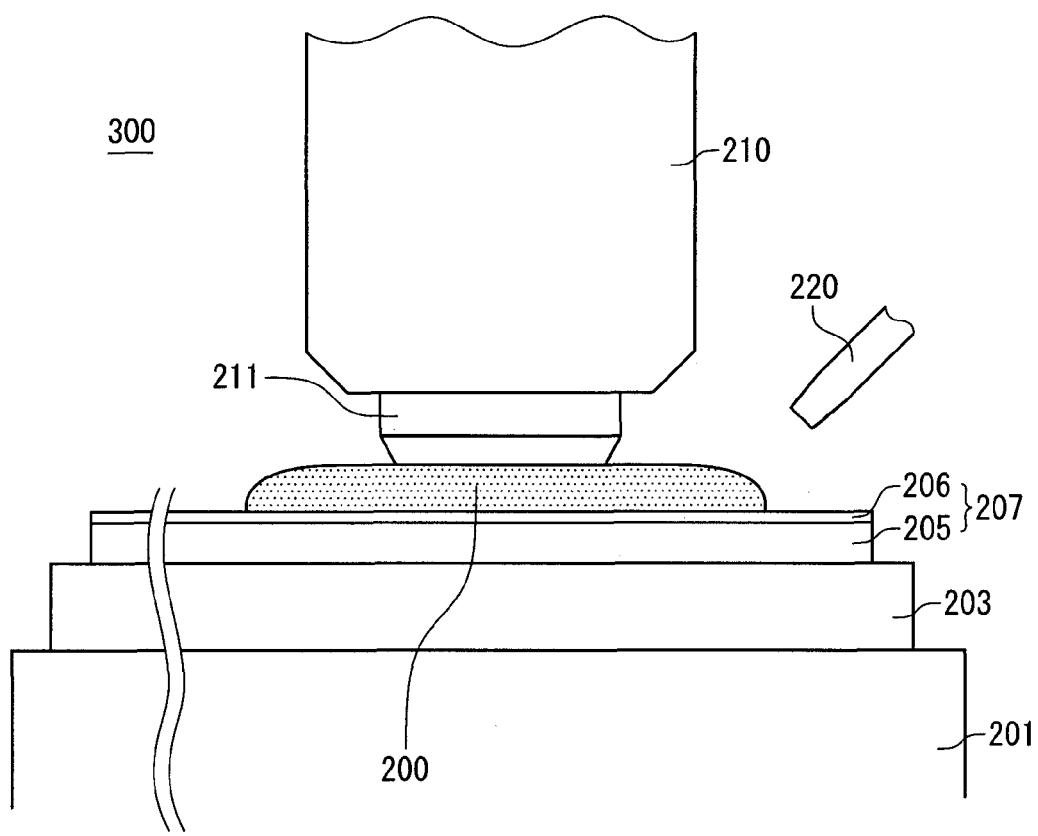

The wet etching method according to the present embodiment is preferably implemented using the wet etching apparatus shown in FIGS. 2A and 29 for etching the workpiece using the etching solution. Specifically, the wet etching method according to the present embodiment can preferably be implemented using a wet etching apparatus 300 comprising an emersion tank 208 for emersion of the workpiece in an etching solution 200 or a spray device 220 for spraying the etching solution 200 against the workpiece, and a laser irradiation device 210 for irradiation of the workpiece by a laser light 180 during etching. The wet etching apparatus further comprises a stage 203 carrying a workpiece 207 on which an interconnect layer 206 is formed on a silicon wafer 205, and the wet etching apparatus further comprises a support platform 201 for carrying the stage 203.

This wet etching apparatus 300 preferably further comprises a lens 211 (lens for incident laser light) such that the irradiation by laser light 180 is possible through the lens 211. Moreover, the lens 211 is preferably disposed such that the lens can contact the etching solution 200.

The above mentioned wet etching method was explained for the above mentioned workpiece 207 and the laser light 180, which are above mentioned constituent elements, and for the other constituent elements. This preferred aspect, configuration, attribute, and the like can also be used for aspects of the present embodiment.

If the present apparatus is used in this manner, damage to the wet etching workpiece is suppressed, and a clean etching shape can be obtained.

The method and apparatus of the present embodiment can be incorporated in the production process for a semiconductor device. Then if trench formation of an interconnect and the like is performed by using wet etching in such a form, the leakage current can be reduced, and an interconnect layer can be obtained which has high TDDB resistance ability. By this means, power consumption can be reduced, and a semiconductor device having high reliability can be produced.

WORKING EXAMPLES

Working examples and comparative examples of the present embodiment are explained next in detail. Furthermore, measurement of etching rate, etching maximum width, and relative dielectric constant were performed by the below described methods.

(Etching Rate)

A spectral ellipsometer was used to measure film thickness by the spectral ellipsometry method. Then etching rate was calculated by comparison with the layer thickness before and after etching. The increase of etching rate due to laser light irradiation is taken to mean the selective increase of etching rate which occurs in the direction of incident laser light. That is to say, this means the rate of highest anisotropy. By this means, damage of the workpiece during wet etching becomes suppressed, and a clean etching shape can be obtained.

(Etching Maximum Width)

This is measured using an SEM (scanning electron microscope) to observe the cross-sectional profile after etching. Specifically, the etched part is cleaved, and the length of the X dimension of FIGS. 1A and 1B is measured. The ability to suppress the etching maximum width means that etching anisotropy is increased. By this means, the damage to the workpiece during wet etching is suppressed, and it becomes possible to obtain a clean etching shape.

(Relative Dielectric Constant)

The dielectric constant was calculated from capacitance measured using a mercury prober (CVmap92A; Four Dimensions, Inc.). Furthermore, a precision LCR meter (4284A; Agilent Technologies, Inc.) was used for measurement of effective relative dielectric constant, which is that of the device and entire element.

Working Example 1

Relative dielectric constant 2.4 coating-type low dielectric constant insulating material formed from a compound containing silicon containing a vinyl group and produced from a monomer which has the below listed structure was spin coated on an ion doped Si low resistivity substrate to produce a 250 nm thick film. Then after prebaking was performed for 3 minutes at 250° C., curing was performed in a $N_2$ atmosphere electric furnace under 30 minutes, 400° C. conditions.

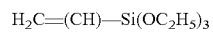

$H_2C\!=\!(CH)\!-\!Si(OC_2H_5)_3$

Thereafter, the film sample produced in this manner was immersed in etching solution, and a projection lens was placed in contact with the alkali etching solution using water as a solvent. Thereafter, light was irradiated through the projection lens, and the etching rate was measured. Sample 2 was produced using an Ar gas laser, sample 3 was produced using a KrF laser, sample 4 was produced using an ArF laser, and sample 5 was produced using a Kr2 laser. A sample 1 was produced in the same manner without laser light irradiation. Moreover, for comparison, a relative dielectric constant 2.6 coating-type low dielectric constant insulating material was spin coated in the above described manner to produce a 250 nm thick film just as the low resistivity substrate above. Then prebaking was performed for 3 minutes at 250° C. This relative dielectric constant 2.6 coating-type low dielectric constant insulating material was a material which resembled the above mentioned silicon containing vinyl containing compound except for a lack of the vinyl group. Moreover, this relative dielectric constant 2.6 coating-type low dielectric constant insulating material was produced from a monomer which had the below listed structure, and this material was made from a silicon containing compound which did not include the vinyl group. Thereafter, curing was performed in a $N_2$ atmosphere electric furnace for 30 minutes under 400° C. conditions, and then sample 6 was produced by performance of treatment in the same manner as sample 3.

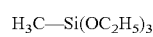

$H_3C\!-\!Si(OC_2H_5)_3$

The etching solution was continuously stirred, and laser light irradiation was continuous.

Etching of each sample was performed until film thickness reached 200 nm. The obtained etching rates are listed below.

TABLE 1

| Sample no. | Laser wavelength (nm) | Etching rate (nm/sec.) |
| --- | --- | --- |
| 1 | no irradiation | 0.02 |
| 2 | 488 (Ar gas) | 0.02 |
| 3 | 248 (KrF) | 4.3 |
| 4 | 193 (ArF) | 5.9 |
| 5 | 146 ($Kr_2$ excimer) | 15.3 |
| 6 (no vinyl group) | 248 (KrF) | 0.05 |

Working Example 2

Relative dielectric constant 2.4 coating-type low dielectric constant insulating material formed from a compound containing silicon containing a vinyl group in the same manner as working example 1 was spin coated to form a 250 nm thick film on the same substrate as working example 1, and the film was pre-baked for 3 minutes at 250° C. Thereafter the substrate coated with the coating-type low dielectric constant insulating material was cured in a $N_2$ atmosphere electric furnace for 30 minutes under 400° C. conditions. Thereafter resist was formed on the sample, and this resist was patterned using a 70 nm pattern width. Thereafter, this film sample was immersed in etching solution, and a projection lens was placed in contact with the alkali etching solution using water as a solvent. Thereafter, laser light was irradiated through the projection lens, and the etching rate was measured. Sample 2' was produced using an Ar gas laser, sample 3' was produced using a KrF laser, sample 4' was produced using an ArF laser, and sample 5' was produced using a Kr2 laser. Also a sample 6' was produced using a mercury lamp rather than laser light, and a similar experiment was performed without laser light irradiation to produce a sample 1'. The experimental method compared the maximum width of the resist pattern when the insulating film had been subjected to 100 nm of etching. Results are shown in Table 2. Furthermore, the etching solution was continuously stirred, and laser light irradiation was continuous.

TABLE 2

| Sample no. | Laser wavelength (nm) | Etching maximum width (nm) |
|---|---|---|
| 1' | no irradiation | 261.0 |
| 2' | 488 (Ar gas) | 255.9 |
| 3' | 248 (KrF) | 75.4 |
| 4' | 193 (ArF) | 78.3 |
| 5' | 146 ($Kr_2$ excimer) | 107.2 |
| 6' | 254 (mercury lamp) | 184.1 |

Working Example 3

The relative dielectric constants were measured for samples 3, 4, and 5 used in working example 1. The measured results are shown in Table 3. Within Table 3, the term "beta film" refers to a sample prior to etching treatment.

TABLE 3

| Sample no. | Presence or absence of the vinyl group | UV laser wavelength (nm) | Relative dielectric constant |
|---|---|---|---|
| 3 | present | 248 (KrF) | 2.5 |
| 4 | present | 193 (ArF) | 2.5 |
| 5 | present | 146 ($Kr_2$ excimer) | 4.7 |
| beta film | present | — | 2.4 |

The increase of relative dielectric constant of sample 5 is thought to have been due to etching damage by the etching solution at the bottom part of the etching.

Working Example 4

A sample was produced using a KrF laser in the same manner as working examples 1 and 2 except for positioning of the projection lens so that the projection lens did not contact the water. The obtained etching rate was 3.7 nm/second, and the etching maximum width was 178.5 nm.

Working Example 5

Figure 3A:
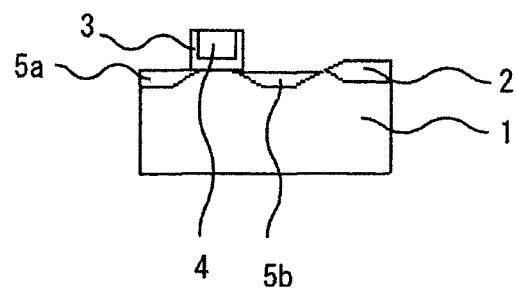
FIGS. 3A to 3K are cross-sectional drawings showing the production method of a multilayer interconnect substrate according to the present embodiment (in the case of separate formation of the via layer and the interconnect layer).
Figure 3B:
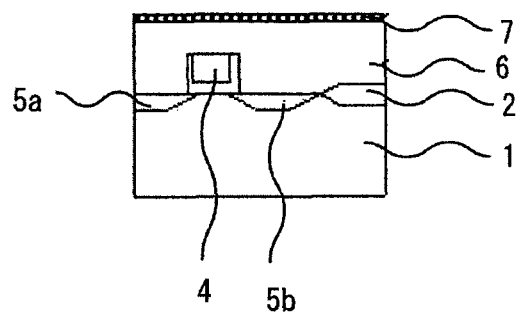
Figure 3C:
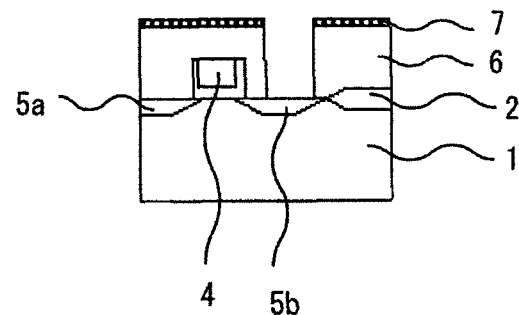

The method for production of the multilayer interconnect substrate according to the present embodiment is shown in FIG. 3A. First, a Si wafer 1 was partitioned by an inter-element partitioning film 2. Then a transistor layer (FIG. 3A) was formed by forming a source diffusion layer 5a and a drain diffusion layer 5b and by forming a gate electrode 4 having a sidewall insulating film 3. Thereafter, on this Si wafer 1 containing this formed transistor layer were formed in turn an interlayer insulating film 6 and a stopper film 7 (FIG. 3B). Thereafter a contact hole for electrode extraction was formed (FIG. 3C).

Figure 3D:
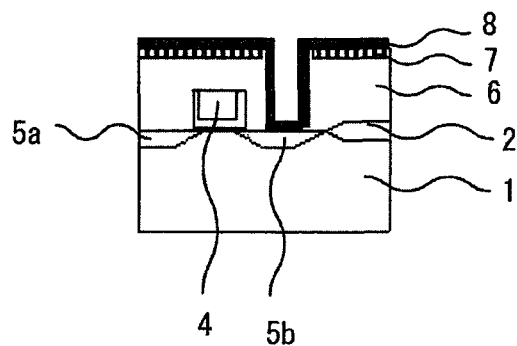
Figure 3E:
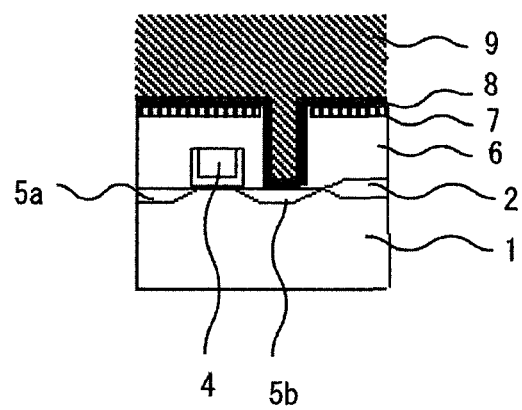
Figure 3F:
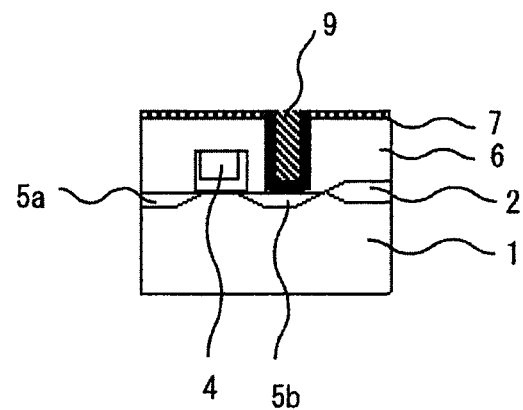

A TiN 8 film of 30 nm thickness was formed on this contact hole by the sputtering method (FIG. 3D). Thereafter, the contact hole was buried with a conductor plug 9 by reduction of a mixture of $WF_6$ and hydrogen (FIG. 3E), and the part outside the via was removed by the chemical mechanical polishing (CMP) method (FIG. 3F).

Figure 3G:
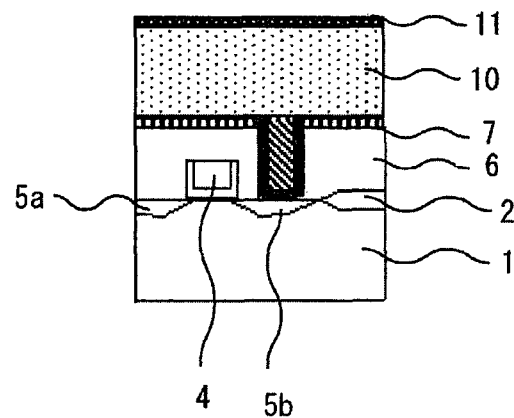

Thereafter, an insulating film 10 (interconnect partition insulating film, relative dielectric constant=2.4) made from a low dielectric constant insulating material having vinyl groups in the same manner as working example 1 was formed under conditions to produce a 150 nm film on the Si wafer. Thereafter, a TEOS-$SiO_2$ 11 of 30 nm thickness was deposited on this Si wafer as a protective film (FIG. 3G).

Figure 3H:
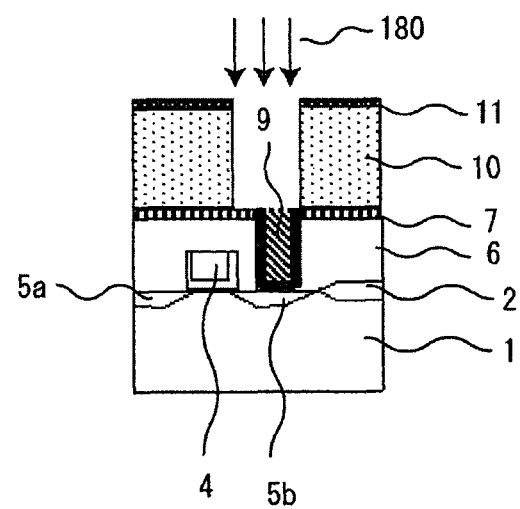

Thereafter, a resist layer having a first layer interconnect pattern was used as a mask while these films (insulating film 10 and protective film 11) were subjected to wet etching while undergoing irradiation by laser light 180 using the conditions of sample 4' of working example 2 (FIG. 3H).

Figure 3I:
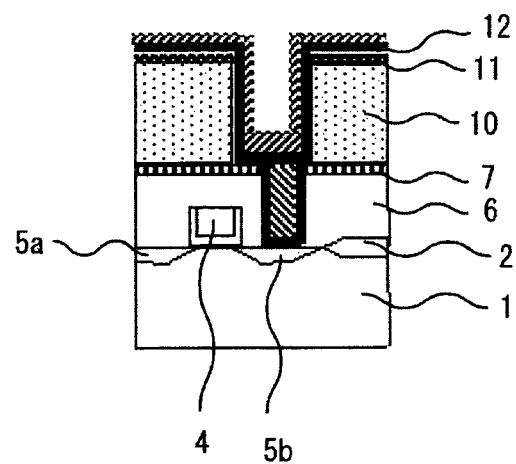
Figure 3J:
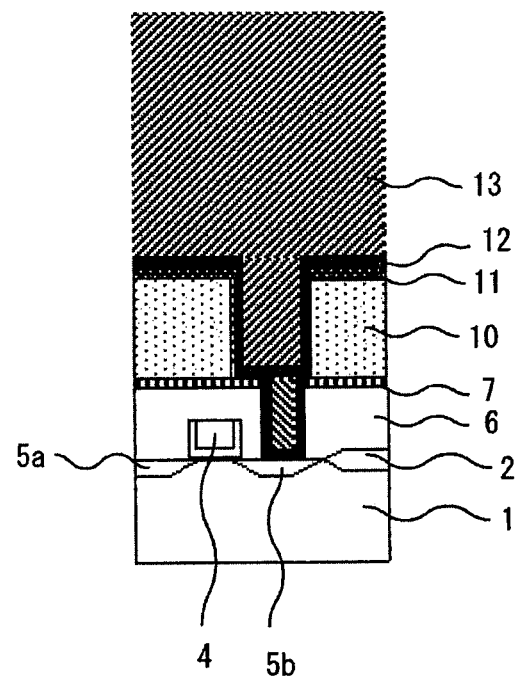
Figure 3K:
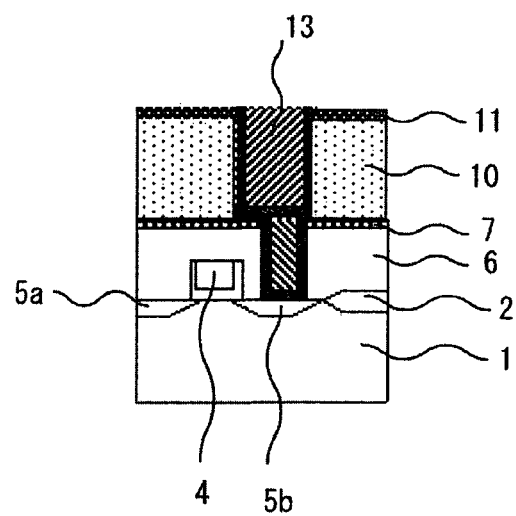

Furthermore, in the interconnect trench formed by processing was formed a TiN 12 film acting as a barrier to prevent diffusion of Cu into the insulating film and a seed layer Cu film acting as an electrode during electrolytic plating. These films were each formed by the sputtering method at a respective layer thickness of 30 nm (FIG. 3I). Then electrolytic plating was used to further deposit a 600 nm thick layer of Cu 13 (FIG. 3J). Thereafter, CMP was used to remove metal outside the interconnect pattern part to form the interconnect layer (FIG. 3K).

Next, explanation will be provided for the dual damascene method which is used when simultaneously forming the via layer and the interconnect layer.

Firstly, a cap SiN 14 is deposited 30 nm thick on the first layer interconnect layer with the object of preventing diffusion of Cu. Next, a SiOC film 15 is deposited 150 nm thick by plasma CVD.

Figure 4A:
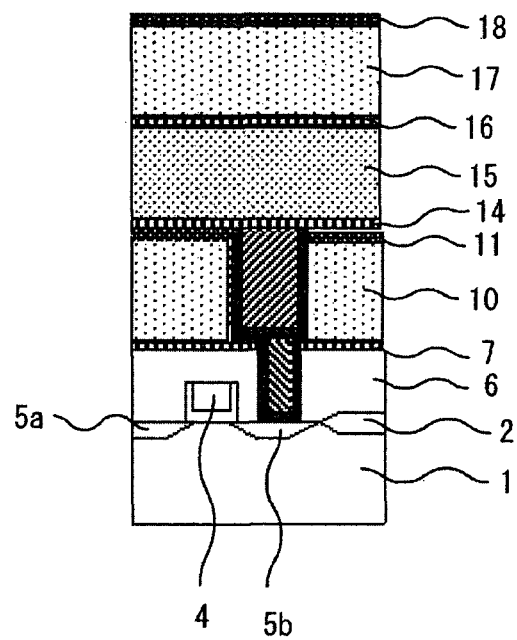
FIGS. 4A to 4F are cross-sectional drawings showing the production method of a multilayer interconnect substrate according to the present embodiment (in the case of simultaneous formation of the via layer and the interconnect layer).

At the interconnect layer part, firstly plasma CVD using silane and ammonia gas was used to deposit 30 nm thickness of a SiN film 16 as a stopper film. Thereafter, a low dielectric constant insulating film 17 (interconnect partition insulating film, relative dielectric constant=2.4, made from a low dielectric constant film having a vinyl group) in the same manner as described above was deposited under conditions to give a thickness of 250 nm on the Si slab. Thereafter, a 30 nm thick film of TEOS-$SiO_2$ 18 was deposited as a protective film (FIG. 4A).

Figure 4B:
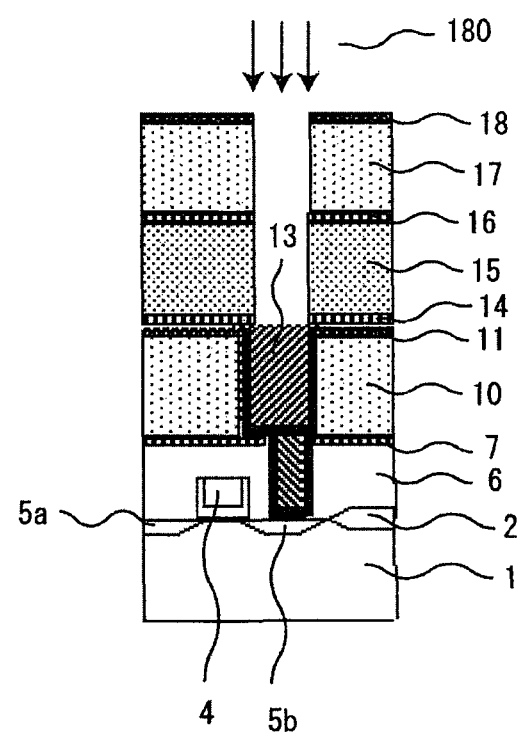

Using a resist layer having a via pattern as a mask for this insulating film, these films were subjected to wet etching. Specifically, these films in order (TEOS-$SiO_2$ 18, low dielectric constant insulating film 17, SiN 16, SiOC 15, and SiN 14) were subjected to wet etching processing while irradiating with laser light 180 using the conditions of sample 4' of working example 2 (FIG. 4B).

Figure 4C:
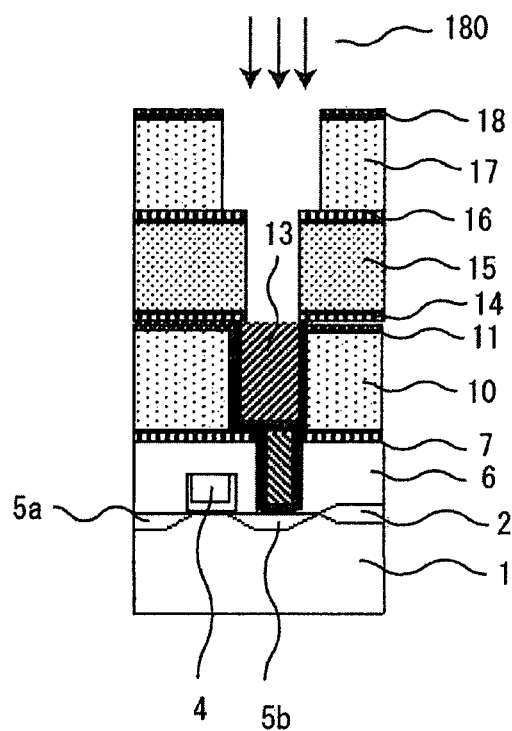
Figure 4D:
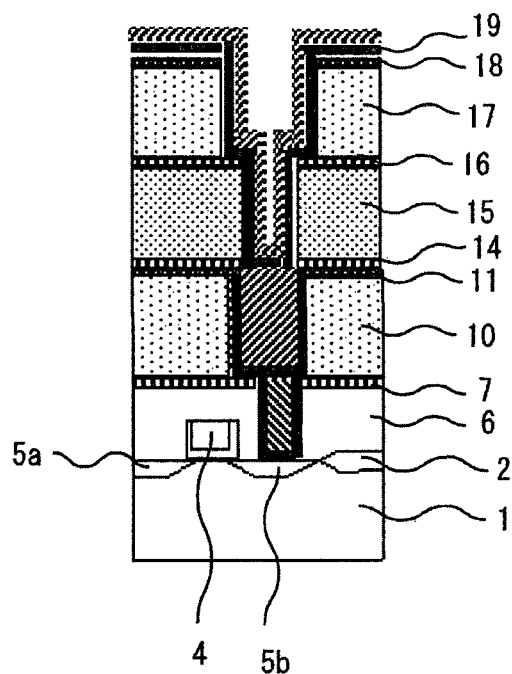
Figure 4E:
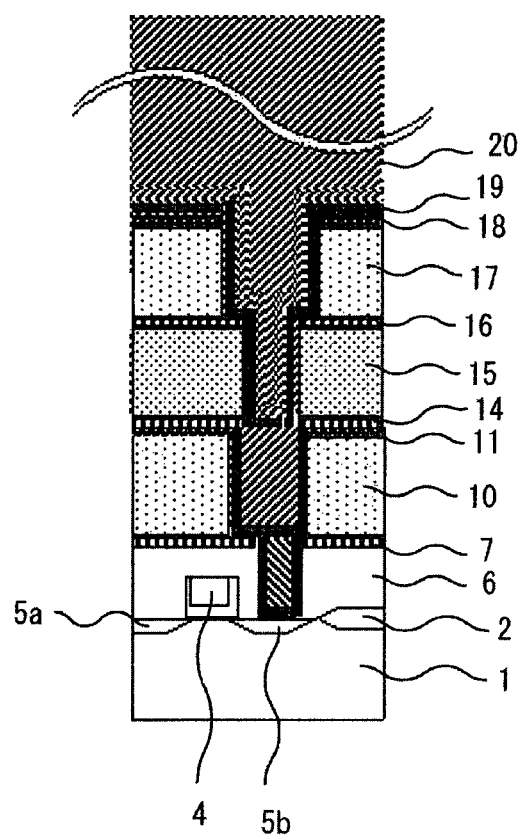
Figure 4F:
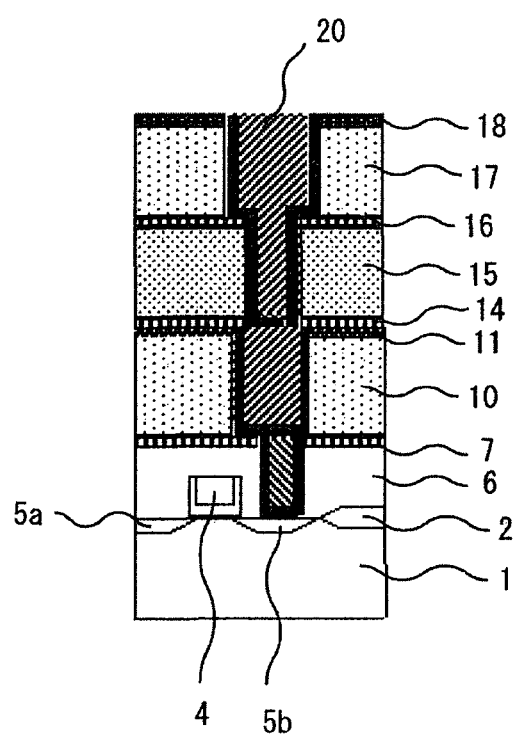

Thereafter, a resist layer applied as a mask for the second layer interconnect pattern was used to form an interconnect trench by treating the low dielectric constant insulating film 17 and the protective film 18 under the same conditions as described previously (treatment of FIG. 4B), (FIG. 4C). Furthermore, a TiN 19 film acting as a barrier to diffusion of Cu into the insulating film and a seed layer Cu film acting as an electrode during electrolytic plating were formed in the via hole and interconnect trench. These films were each formed by the sputtering method at a respective layer thickness of 30 nm (FIG. 4D). Then electrolytic plating was used to further deposit a 1400 nm thick layer of Cu 20 (FIG. 4E). Thereafter, CMP was used to remove metal outside the interconnect pattern part to form the interconnect layer (FIG. 4F) These steps were then repeated to form 3 layers of interconnects. When capacitance between interconnects was measured using a test multilayer interconnect comb-tooth pattern, the effective relative dielectric constant was 3.0.

Comparative Example 1

3 layers of interconnects were formed in exactly the same manner except for non-use of wet etching during the etching processing of working example 5 (etching by F plasma using $CF_4/CHF_3$ gas as raw material). When capacitance between interconnects was measured using a test multilayer interconnect comb-tooth pattern, the effective relative dielectric constant was 3.7.

According to the present embodiment in this manner, technology is provided which suppresses damage by the etching solution to the workpiece during wet etching and which obtains a clean etching shape. According to the present embodiment, an interconnect layer of high TDDB resistance ability can be obtained with low leakage current. By this means, a semiconductor device can be produced which has low power consumption and high reliability.

What is claimed is:

1. A wet etching method, comprising:
    forming an interconnect layer insulating film comprising a material having an unsaturated bond on a substrate, the interconnect layer insulating film being part of a semiconductor device; and
    forming an interconnect trench in the interconnect layer insulating film by wet etching the insulating film using an etching solution while irradiating laser light to the interconnect layer insulating film,
    wherein the unsaturated bond is a carbon-to-carbon double bond or a carbon-to-carbon triple bond.

2. The wet etching method according to claim 1,
    wherein the insulating film has a relative dielectric constant less than or equal to 2.7.

3. The wet etching method according to claim 1,
    wherein the laser light is irradiated to the insulating film through a lens.

4. The wet etching method according to claim 3,
    wherein the etching solution contacts the lens.

5. The wet etching method according to claim 1,
    wherein a wavelength of the laser light is in the range of 150 nm to 400 nm.

6. The wet etching method according to claim 5,
    wherein the laser light is selected from among a group consisting of: ArF laser light, KrF laser light, KrCl laser light, Nd:YAG 4th harmonic laser light, and Nd:YAG 5th harmonic laser light.

7. A method of producing a semiconductor device, comprising:
    forming an interconnect layer insulating film comprising a material having an unsaturated bond on a substrate, the interconnect layer insulating film being part of a semiconductor device; and
    forming an interconnect trench in the interconnect layer insulating film by wet etching the insulating film while irradiating laser light to the interconnect layer insulating film,
    wherein the unsaturated bond is a carbon-to-carbon double bond or a carbon-to-carbon triple bond.

* * * * *